United States Patent
Lee et al.

(10) Patent No.: US 6,758,898 B2
(45) Date of Patent: *Jul. 6, 2004

(54) METHOD FOR SINGLE CRYSTAL GROWTH OF BARIUM TITANATE AND BARIUM TITANATE SOLID SOLUTION

(75) Inventors: Ho-Yong Lee, Seoul (KR); Jao-Suk Kim, Seoul (KR); Jong-Bong Lee, Choongchung-Nam-Do (KR); Tae-Moo Hur, Kyeongki-Do (KR); Doe-Yeon Kim, Seoul (KR); Nong-Moon Hwang, Seoul (KR); Byoung-Ki Lee, Taejeon-Kwangyeoksi (KR); Sung-Yoon Chung, Seoul (KR); Suk-Joong L. Kang, Taejeon-Kwangyeoksi (KR)

(73) Assignee: Ceracomp Co. Ltd., Asan-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/163,526

(22) Filed: Jun. 7, 2002

(65) Prior Publication Data

US 2003/0015130 A1 Jan. 23, 2003

Related U.S. Application Data

(63) Continuation of application No. 09/646,610, filed as application No. PCT/KR00/00656 on Feb. 20, 2001, now Pat. No. 6,482,259.

(30) Foreign Application Priority Data

| Jun. 23, 1999 | (KR) | 1999-23660 |
| Feb. 23, 2000 | (KR) | 2000-8916 |
| Feb. 23, 2000 | (KR) | 2000-8917 |
| Apr. 19, 2000 | (KR) | 2000-20620 |

(51) Int. Cl.$^7$ ................................. C30B 1/02
(52) U.S. Cl. ................. 117/3; 117/4; 117/7; 117/8; 117/10; 117/949
(58) Field of Search ............. 117/3, 4, 7, 8, 117/10, 949

(56) References Cited

U.S. PATENT DOCUMENTS

5,541,764 A 7/1996 Zhu et al.
6,482,259 B1 * 11/2002 Lee et al. .................. 117/3

FOREIGN PATENT DOCUMENTS

JP 04-042855 2/1992
JP 4-300296 10/1992

OTHER PUBLICATIONS

Yamamoto, et al., Fabrication of Barium Titanate Single Crystals by Solid–State Grain Growth, Journal of the American Ceramic Society, 77(4):1107–1109 (1994).

* cited by examiner

Primary Examiner—Robert Kunemund
(74) Attorney, Agent, or Firm—Browdy and Neimark

(57) ABSTRACT

The invention relates to a method for growing single crystals of barium titanate [$BaTiO_3$] and barium titanate solid solutions [$(Ba_xM_{1-x})(Ti_yN_{1-y})O_3$]. This invention is directed to a method for growing single crystals of barium titanate or barium titanate solid solutions showing the primary and secondary abnormal grain growths with increasing temperature higher than the liquid formation temperature, characterized by comprising the step for a few secondary abnormal grains to continue to grow at a temperature slightly below the critical temperature where the secondary abnormal grain growth starts to occur. The method for growing single crystals of barium titanate or barium titanate solid solutions according to this invention has the advantage of providing an effective low cost in manufacturing process for single crystals by using a conventional heat-treatment process without the need of special equipment. The method for growing single crystals of barium titanate and barium titanate solid solutions according to this invention is also applicable to other material systems showing abnormal grain growth behavior.

16 Claims, 17 Drawing Sheets

Secondary abnormal grains 1 cm

Single crystal of barium titanate solid solution with Mn 1 cm

Additive

Grown single crystal (2 cm)

Seed single crystal
(Primary seed single crystal
=Single crystal of barium titanate)

Polycrystal of barium titanate or barium titanate solid solution (Powder molded body or sintered body)

(a)

(b)

(c)

(d)

1 cm 1 cm 1 cm 3 cm 3 cm 2.5 cm 1 cm 1 cm 1 cm (a)

(b)

(a)

(b)

(c)

METHOD FOR SINGLE CRYSTAL GROWTH OF BARIUM TITANATE AND BARIUM TITANATE SOLID SOLUTION

CROSS REFERENCE TO RELATED APPLICATIONS

The present application is a continuation of Ser. No. 09/646,610, filed Feb. 20, 2001, now U.S. Pat. No. 6,482,259 which is the national phase of PCT KR00/00656, filed Jun. 21, 2000, the entire contents of which are hereby incorporated by reference.

BACKGROUND OF THE INVENTION

1. Field of the Invention

The present invention relates to a method for growing single crystals of barium titanate [$BaTiO_3$] and barium titanate solid solutions [$(Ba_xM_{1-x})(Ti_yN_{1-y})O_3$] and, more particularly, to a method for growing single crystals based on the principle that a secondary abnormal grain growth occurs at an elevated temperature higher than a predetermined temperature during the heat treatment of polycrystalline barium titanate and that the predetermined temperature depends on various additives used, whereby only a few secondary abnormal grains can continuously grow to produce single crystals by controlling the heat treatment temperature of a polycrystal or locally adding an additive to a sample.

The term "barium titanate solid solution" as used herein refers to a solid solution containing a solute such as MO or NO in barium titanate, and has a chemical formula of $(Ba_xM_{1-x})(Ti_yN_{1-y})O_3$ which is distinct in physical and chemical properties from a mixture of pure barium titanate powder with an impurity.

The invention also relates to a method for producing single crystals of barium titanate and barium titanate solid solutions in which the single crystal of barium titanate [$BaTiO_3$] is embedded as a seed single crystal in the polycrystal of the barium titanate and barium titanate solid solutions, followed by heat treatment, thereby allowing a single crystal to continuously grow in the polycrystals by a secondary abnormal grain growth at an interface between the polycrystal and seed single crystal, wherein the single crystals of barium titanate and barium titanate solid solution thus obtained have the same composition as that of the original polycrystal as well as the same structure as that of the seed single crystal. The invention further refers to an economical method for producing a large amount of single crystals by embedding the produced single crystals of barium titanate and barium titanate solid solution prepared by the above-stated method as a seed single crystal in the polycrystal.

Still further, the present invention relates to a method for producing single crystals of barium titanate and barium titanate solid solutions, comprising the steps of: implanting a seed single crystal in the polycrystal of barium titanate while restraining abnormal grain growths by performing a heat treatment under a reductive atmosphere, and then controlling the temperature, composition and atmosphere of the heat treatment to cause an abnormal grain growth at an interface between the polycrystal and the seed single crystal, thereby allowing the seed single crystal to continuously grow into the polycrystal.

2. Description of the Related Art

The single crystals of barium titanate and barium titanate solid solutions are widely used as a material for optical devices such as piezoelectric sensors, optical valves, optical interrupters, and phase-matching mirrors, etc. and are considered to be promising substrate materials for various thin film elements.

The conventional method for growing a single crystal of barium titanate [$BaTiO_3$] requires expensive facilities and involves many problems in producing a large amount of large single crystals because of an extremely complicated process for growing the single crystals.

Grain growth takes place during the step of sintering polycrystals, in which case only a few grains are sometimes rapidly grown in an abnormal manner relative to the most normal grains. It is appreciated that controlling the growth of such a few abnormal grains in polycrystals may allow single crystals to be easily produced without a melting process.

A general method for single crystal growth using the melting process is called liquid-state single crystal growth (LSCG), and a method for single crystal growth by heat treatment of polycrystals is referred to as solid-state single crystal growth (SSCG). The SSCG method has been suggested since the 1950's and demonstrated as an effective method of preparing single crystals of a metal, which is limited to only a few types. It is however reported that it is difficult to prepare single crystals large enough for practical use from an oxide by this method, because the oxide is slow in grain growth and it is difficult to control the nucleation of abnormal grains.

Since the emergence of a flux method for single crystal growth of barium titanate and barium titanate solid solution, subsequent methods for single crystal growth of barium titanate have been developed, such as the zone melting method and the top-seeded solution growth (TSSG) method. However, these methods present some problems in that the crystals thus obtained do not have a cubic structure, as normally desired, but a hexagonal structure which is stable at high temperature and that the methods require considerably complicated production techniques and facilities. So, the methods are too problematic for use in preparing a large amount of inexpensive, large-sized single crystals almost without residual stress. The single crystals of barium titanate grown by the flux methods have a thickness of less than 1 mm and a diameter of several millimeters and thus are actually restrained in practical uses. It is known that the TSSG method, which has the advantages of the flux method and the Czochralski method, is applicable to the growth of relatively large single crystals of barium titanate almost without residual stress. However, the TSSG method also requires complicated facilities and sophisticated skills and is inadequate as a method for preparing a large amount of single crystals at a low cost.

Meanwhile, there has been made an attempt to obtain single crystals by subjecting polycrystals of ferrite, barium titanate [$BaTiO_3$] and aluminum oxide [$Al_2O_3$] to sintering. This method for single crystal growth involves sintering a powder impregnated with single crystals as seed single crystals or providing an interface between the sintered bodies and the seed single crystals, followed by heat treatment. Disadvantageously, this method is not suitable to preparing single crystals large enough for practical uses because the growth of single crystals is retarded relative to the conventional growth methods.

For single crystal growth of barium titanate [$BaTiO_3$], there is reported a method for preparing single crystals by adding particles having a (111) twin plane or a seed forming agent to form a (111) twin plane. However, this method has a problem in that the additives are alloyed in barium titanate during the heat treatment and thus pure single crystals of barium titanate cannot be produced. Also, the method has a second problem in that it is most important but difficult to limit the number of crystals to be grown abnormally and that the single crystals thus obtained are small in size.

Contrarily, the invention provides a method for single crystal growth by controlling the temperature for heat treatment or adding seed single crystals and additives so as to control the nucleation and growth of the secondary abnormal grains in performing a heat treatment on barium titanate and barium titanate solid solution. The present invention makes it possible to prepare a large amount of the single crystals of barium titanate and barium titanate solid solution without expensive facilities or complicated processes.

Alternatively, the present invention involves sintering barium titanate and barium titanate solid solution under reductive atmosphere to restrain abnormal grain growth and obtain dense polycrystals, implanting seed single crystals on the polycrystals, and performing a heat treatment under the condition such that the abnormal grain growth occurs only at an interface between polycrystals and seed single crystals so as to grow the seed single crystals into the polycrystals successively, thereby preparing single crystals of barium titanate and barium titanate solid solution.

SUMMARY OF THE INVENTION

It is, therefore, an object of the present invention is to overcome the problems of the conventional single crystal growth (i.e., liquid-state single crystal growth) method requiring a melting process, and to provide a method for growing single crystals of barium titanate and barium titanate solid solutions through a general heat treatment without special equipment, thereby producing a large amount of the single crystals at reduced cost.

To achieve the object of the present invention, there is provided a method for growing single crystals of barium titanate [$BaTiO_3$] and barium titanate solid solutions [$(Ba_xM_{1-x})(Ti_yN_{1-y})O_3$], which shows primary and secondary abnormal grain growths by means of a temperature condition higher than a predetermined temperature, or the composition of a polycrystal and an atmosphere of heat treatment, comprising the steps of: (a') performing a heat treatment at a temperature higher than a secondary abnormal grain growth activating temperature to produce only a few secondary abnormal grains; and (a) performing a second heat treatment at a temperature lower than the secondary abnormal grain growth activating temperature of the polycrystal, thereby allowing only a few secondary abnormal grains to grow continuously.

In another aspect of the present invention, there is provided a method for growing single crystals of barium titanate [$BaTiO_3$] and barium titanate solid solutions [$(Ba_xM_{1-x})(Ti_yN_{1-y})O_3$], which shows primary and secondary abnormal grain growths at a temperature higher than a predetermined temperature, or depending on the composition of a polycrystal and an atmosphere of heat treatment, comprising the steps of: (a") adjoining a seed single crystal to the polycrystal; and (a) performing a second heat treatment to cause the secondary abnormal grain growth at an interface between the polycrystal and the seed single crystal, thereby allowing the same structure of the seed single crystal to grown continuously in the polycrystal.

In still another aspect of the present invention, there is provided a method for growing single crystals of barium titanate [$BaTiO_3$] and barium titanate solid solutions [$(Ba_xM_{1-x})(Ti_yN_{1-y})O_3$], which shows primary and secondary abnormal grain growths at a temperature higher than a predetermined temperature, or depending on the composition of a polycrystal and an atmosphere of heat treatment, comprising the steps of: (a") preparing a polycrystal of barium titanate inhibited from the abnormal grain growths through sintering under a reductive atmosphere and adjoining the polycrystal to a seed single crystal; and (a) controlling the temperature, composition and atmosphere to cause abnormal grain growths at an interface between the polycrystal and the seed single crystal, thereby allowing the seed single crystal to continuously grow into the polycrystal. In this method, single crystals of barium titanate and an oxide having the same crystallographic structure as barium titanate can be used as a seed single crystal. Such an oxide is $SrTiO_3$ or $CaTiO_3$. Preferably, step (a) is performed under an oxidative atmosphere.

DETAILED DESCRIPTION OF THE PREFERRED EMBODIMENT

Hereinafter, preferred embodiments of a method for growing single crystals of barium titanate and barium titanate solid solution according to the present invention will be described in detail with reference to the accompanying drawings.

The method for growing single crystals of barium titanate and barium titanate solid solution according to the present invention involves controlling a secondary abnormal grain growth in producing the single crystals.

The abnormal grain growth of barium titanate and barium titanate solid solution occurs in two stages, i.e., primary and secondary abnormal grain growths, with increasing temperature higher than the liquid forming temperature. Such abnormal grain growths are dependent upon the Ba/Ti ratio in the barium titanate [$BaTiO_3$] powder, the type and content of additives insoluble in the barium titanate, and the type and content of solutes soluble in the barium titanate.

The crystal produced by the secondary abnormal grain growth may grow continuously at a temperature slightly below the secondary abnormal grain growth activating temperature or the critical temperature where the secondary abnormal grain growth starts to occur. Thus the present invention performs a heat treatment at the secondary abnormal grain growth activating temperature, and then lowers the temperature slightly below the secondary abnormal grain growth activating temperature, thereby allowing the secondary abnormal grains to grow continuously.

Figure 1A:
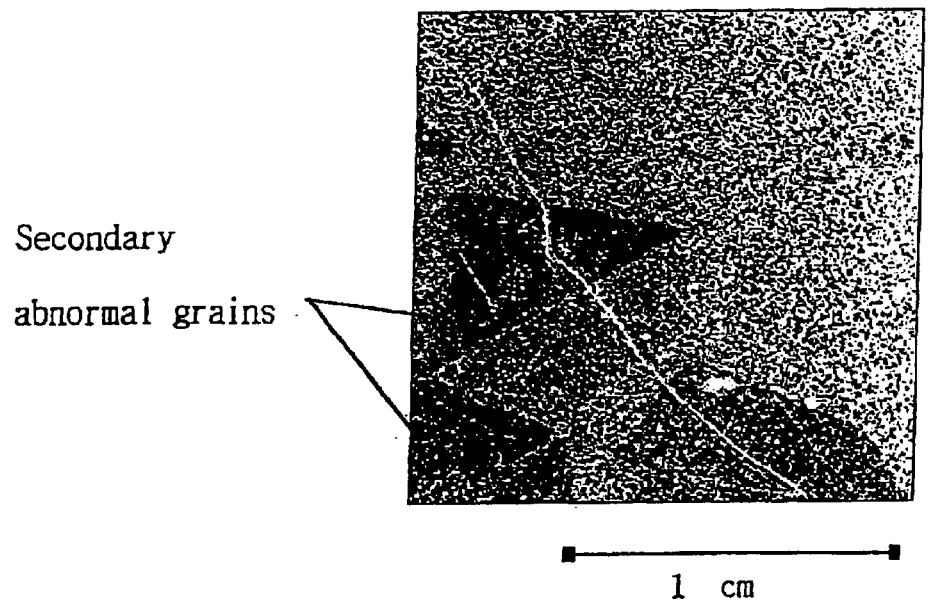
FIGS. 1a–d shows microscopic photographs for showing a secondary abnormal grain growth.
Figure 1B:
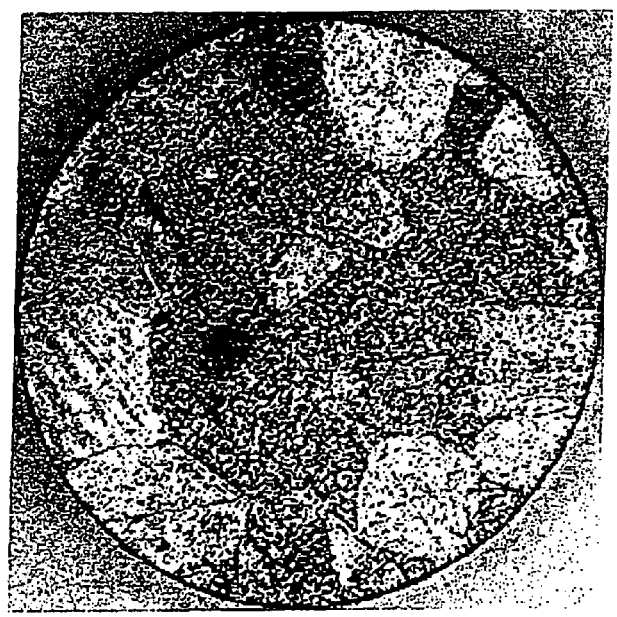
Figure 1C:
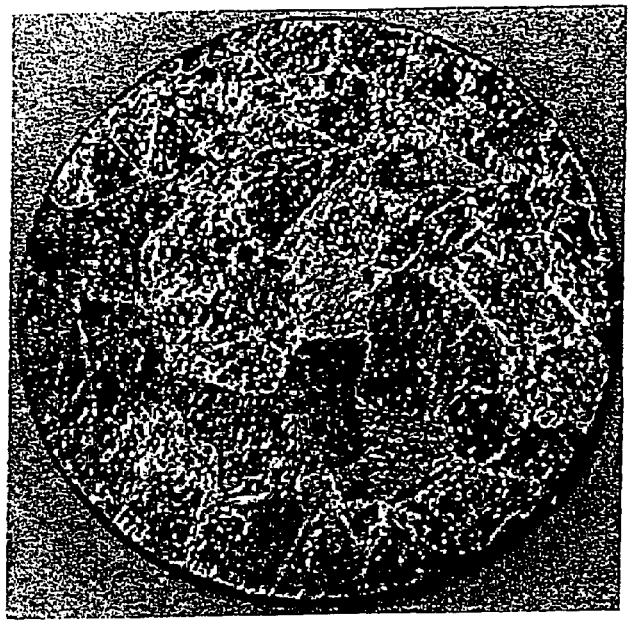
Figure 1D:
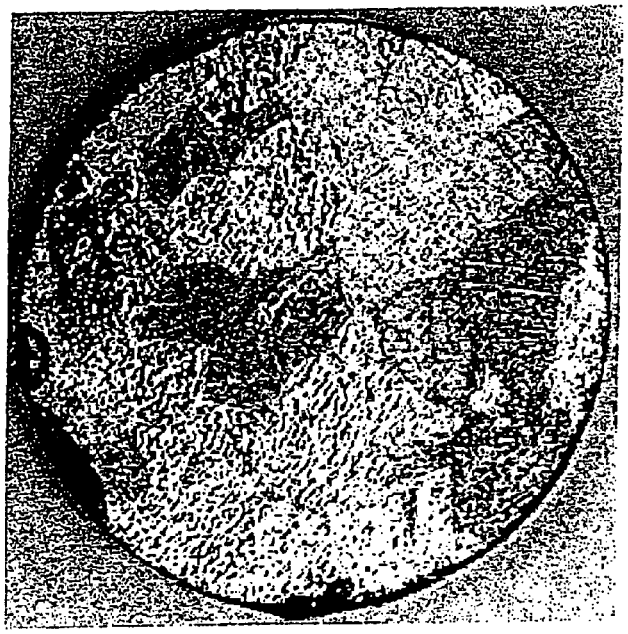

FIG. 1 shows microscopic photographs of secondary abnormal grains, in which FIG. 1a is a microscopic photograph of a sample obtained from an undoped barium titanate powder sintered at 1360° C. for 50 hours; FIG. 1b is a microscopic photograph of a sample obtained from a powder, comprising 99.9 mol % of $BaTiO_3$ and 0.1 mol % of CoO, sintered at 1360° C. for 50 hours; FIG. 1c is a microscopic photograph of a sample obtained from a powder, comprising 99.9 mol % of $BaTiO_3$ and 0.1 mol % of $CrO_{1.5}$, sintered at 1360° C. for 50 hours; and FIG. 1d is a microscopic photograph of a sample obtained from a powder, comprising 99.9 mol % of $BaTiO_3$ and 0.1 mol % of MnO, sintered at 1360° C. for 50 hours.

In FIG. 1, the secondary abnormal grain growth takes place after the completion of the primary abnormal grain growth at a temperature higher than the liquid forming temperature. The crystal produced by the secondary abnormal grain growth has a large size of approximately several millimeters. The secondary abnormal grains appear at a specific temperature depending on the composition but, once produced, may continue to grow even at a temperature slightly below the secondary abnormal grain growth activating temperature.

Thus, large single crystals of barium titanate and barium titanate solid solution can be obtained by performing a heat treatment for a short time at an elevated temperature higher than the secondary abnormal grain growth activating temperature on a barium titanate powder or a powder molded body, obtained by mixing barium titanate powder and solutes soluble in barium titanate, and lowering the heat treatment temperature lower than the secondary abnormal grain growth activating temperature to allow only a few secondary abnormal grains to grow continuously.

Figure 2:
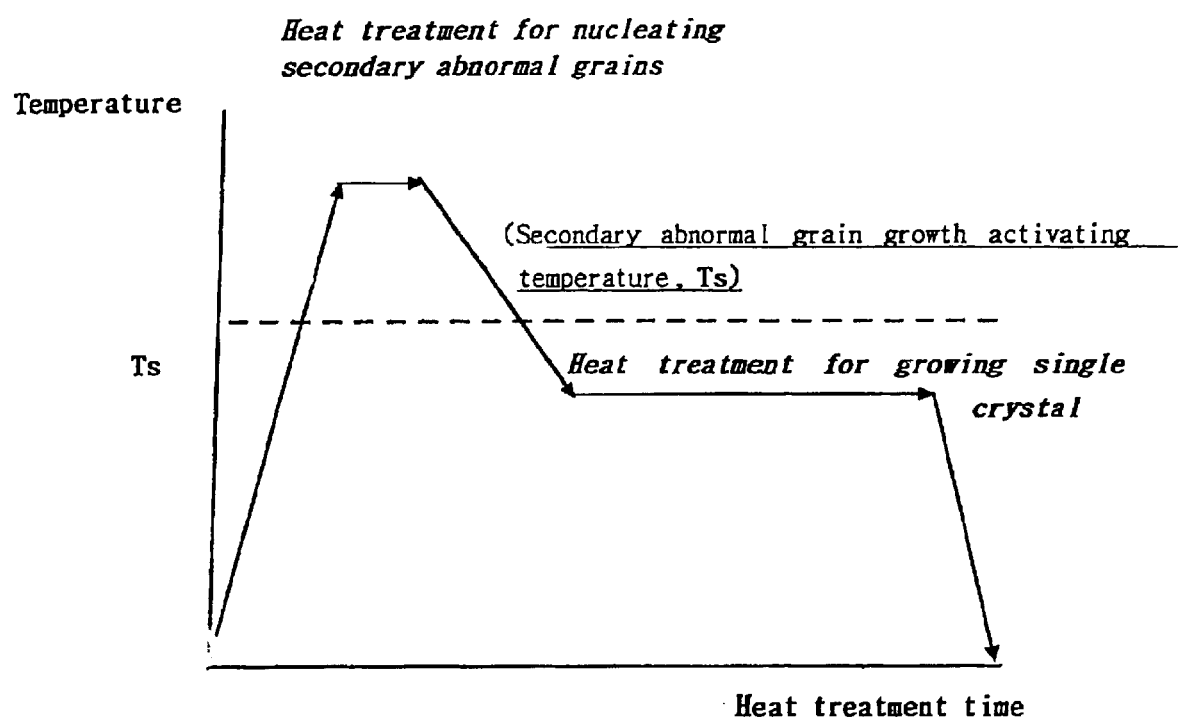
FIG. 2 is an illustration for explaining a temperature control in a method for growing single crystals of barium titanate [$BaTiO_3$] and barium titanate solid solutions [$(Ba_xM_{1-x})(Ti_yN_{1-y})O_3$] in accordance with the present invention.

FIG. 2 is an illustration for explaining a temperature control in the method for single crystal growth of barium titanate and barium titanate solid solution according to the present invention, in which Ts represents the secondary abnormal grain growth activating temperature. As shown in FIG. 2, the method involves a heat treatment for a short time at an elevated temperature higher than the secondary abnormal grain growth activating temperature, and a second heat treatment at a lowered temperature lower than the secondary abnormal grain growth activating temperature, thereby allowing only the secondary abnormal grains to grow continuously In a method for growing a single crystal of barium titanate solid solutions [$(Ba_xM_{1-x})(Ti_yN_{1-y})O_3$] according to the present invention, at least one additive is added as a solute to a barium titanate powder to form a powder molded body, wherein the additive is selected from the group consisting of BaO, $Bi_2O_3$, CaO, CdO, $CeO_2$, CoO, $Cr_2O_3$, $Fe_2O_3$, $HfO_2$, $K_2O$, $La_2O_3$, MgO, $MnO_2$, $Na_2O$, $Nb_2O_5$, $Nd_2O_3$, NiO, PbO, $Sc_2O_3$, $SmO_2$, $SnO_2$, SrO, $Ta_2O_5$, $TiO_2$, $UO_2$, $Y_2O_3$, ZnO, and $ZrO_2$. The powder molded bodies of the respective compositions containing an additive are subjected to a heat treatment at different temperatures to determine the secondary abnormal grain growth activating temperature depending on the type and content of the solute, and subjected to a second heat treatment at the secondary abnormal grain growth activating temperature determined.

When a heat treatment is performed on a polycrystal containing a solute whose type and content are varied in a continuous or discrete manner, secondary abnormal grains are produced in a region having the lowest secondary abnormal grain growth activating temperature and grown to another region of a different composition, thereby producing the single crystal of barium titanate solid solution with a composition gradient in the single crystal.

Specifically, a temperature gradient is provided in a barium titanate powder or a powder molded body obtained by mixing a barium titanate with a solute soluble in the barium titanate such that the temperature increases above the secondary abnormal grain growth activating temperature only at the end portion of the sample, in which the secondary abnormal grains are produced and then grown into large single crystals.

That is, the method for growing single crystals of barium titanate and barium titanate solid solutions according to the present invention varies the heat treatment temperature of the powder molded body obtained by mixing a barium titanate powder with a solute soluble in the barium titanate, thereby causing a secondary abnormal grain growth.

The present invention also uses an additive for lowering the secondary abnormal grain growth activating temperature of barium titanate or barium titanate solid solutions. The secondary abnormal grain growth activating temperature of barium titanate or barium titanate solid solutions depends on the Ba/Ti ratio or the type of a solute added in the barium titanate powder. More specifically, at least one additive is locally added as a solute to the power of barium titanate or barium titanate solid solution and the additive is at least one selected from the group consisting of $Al_2O_3$, $B_2O_3$, CuO, $GeO_2$, $Li_2O_3$, $MnO_2$, $P_2O_5$, PbO, $SiO_2$, $TiO_2$, and $V_2O_5$. The mixture is then subjected to a heat treatment so as and to produce secondary abnormal grains only around the region enriched with the additive and successively grow them, thus easily obtaining single crystals.

Figure 3:
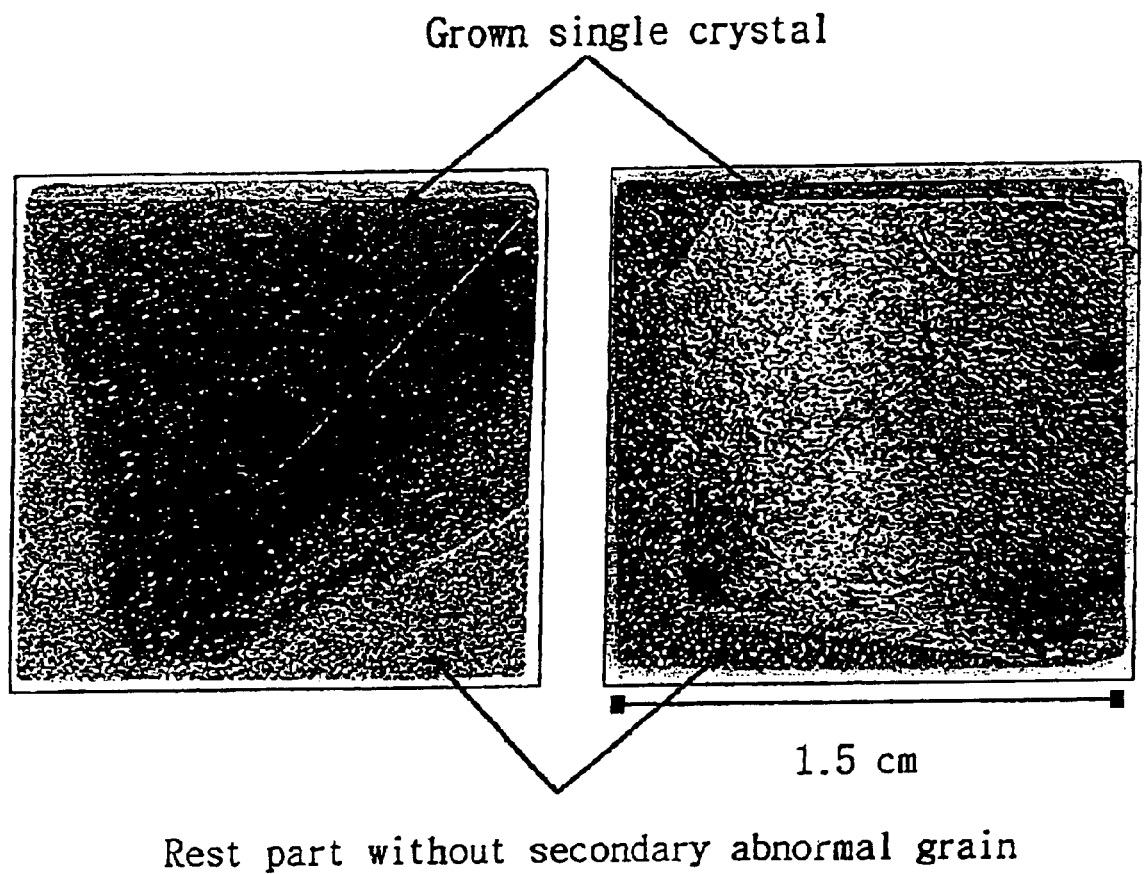
FIG. 3 is a microscopic photograph showing the appearance of samples with the single crystal of barium titanate grown by the heat treatment shown in FIG. 2.

FIG. 3 is a microscopic photograph showing the appearance of samples with single crystals of barium titanate grown by the heat treatment shown in FIG. 2. It is observed from FIG. 3 that the most part of the samples are changed to a single crystal as a large abnormal grain because only one secondary abnormal grain continues to grow with the other regions not showing the secondary abnormal grain growth. The speed of the growth is approximately 300 to 500 $\mu$m/h.

Figure 4:
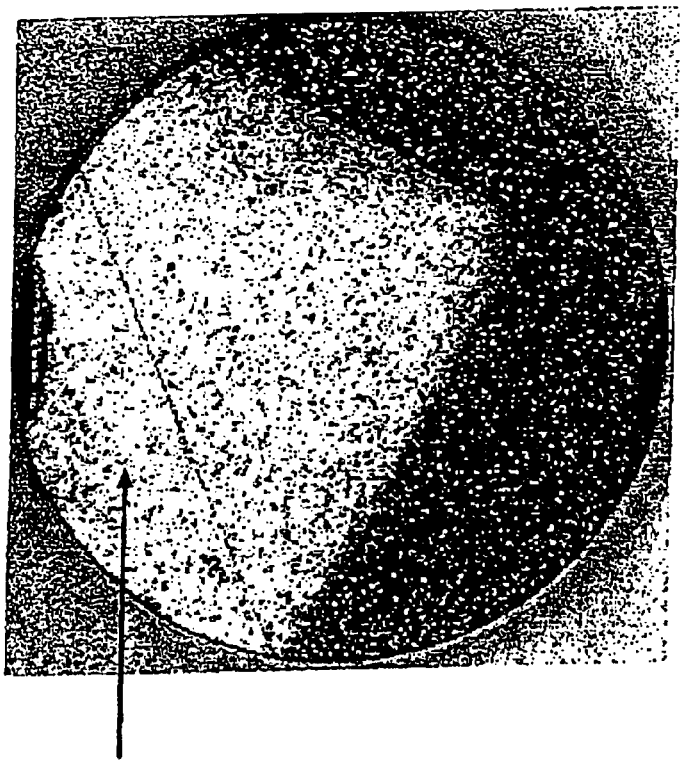
FIG. 4 is a microscopic photograph showing the appearance of a sample with a single crystal of the barium titanate solid solution grown by the heat treatment shown in FIG. 2.

FIG. 4 is a microscopic photograph showing the appearance of a sample with the single crystal of a barium titanate solid solution comprising 99.9 mol % of $BaTiO_3$ and 0.1 mol % of MnO obtained in the embodiment of the present invention. It is observed from FIG. 4 that the most part of the sample is changed to a single crystal as a large abnormal grain because only one secondary abnormal grain continues to grow with the other regions not exhibiting the secondary abnormal grain growth. The speed of the growth is approximately 200 to 500 $\mu$m/h.

Figure 5:
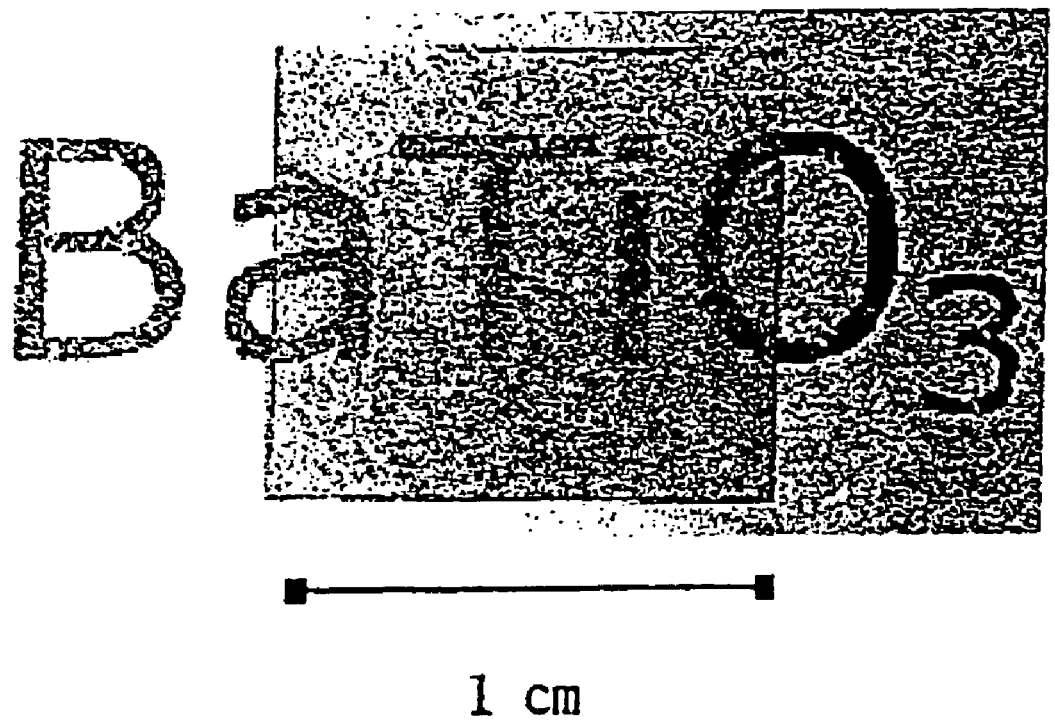
FIG. 5 is a microscopic photograph showing a single crystal of barium titanate ($BaTiO_3$) isolated from a sample subjected to heat treatment at different temperatures according to a method of the present invention.

FIG. 5 is a microscopic photograph showing the single crystal of barium titanate [$BaTiO_3$] isolated from the sample subjected to heat treatment at different temperatures in the method of the present invention. The photograph shown in FIG. 5 is taken with the single crystal isolated from the sample and ground on both sides thereof. It can be seen that the single crystal is transparent enough to show the letters written on the paper, which underlies the single crystal.

Figure 6:
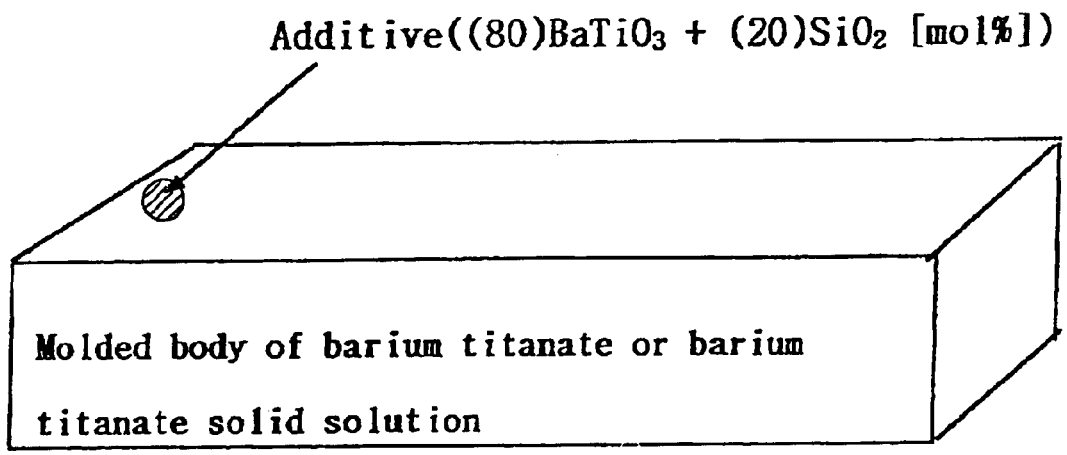
FIG. 6 is an illustration for explaining the case of using an additive for lowering the secondary abnormal grain growth activating temperature of barium titanate or barium titanate solid solutions in the method of the present invention.

FIG. 6 is an illustration for explaining the case of using an additive for decreasing the secondary abnormal grain growth activating temperature of barium titanate or barium titanate solid solutions, in which the additive comprises 80 mol % of $BaTiO_3$ and 20 mol % of $SiO_2$ and is locally added to a molded body of barium titanate or barium titanate solid solutions. As shown in FIG. 6, although such an additive lowers the secondary abnormal grain growth activating temperature at the target region of the sample, secondary abnormal grains are formed first in the target region containing the additive during a heat treatment at a temperature slightly below the secondary abnormal grain growth activating temperature. The secondary abnormal grains thus nucleated are then allowed to grow continuously towards the other region of the sample destitute of the additive, thereby providing a large single crystal of barium titanate or barium titanate solid solutions.

In another method for growing single crystals of barium titanate and barium titanate solid solutions according to the present invention, the porosity and the pore shape of a polycrystal are controllable depending on sintering temperature, sintering atmosphere (e.g., air, oxygen or vacuum), sintering pressure in the uniaxial hot pressing or hot isostatic pressing, the amount of liquid phase and additives. The polycrystal of various porosities and pore shapes makes it possible to produce a single crystal having various pore structures. A single crystal in the perfectly dense polycrystal can be grown into a large amount of perfectly dense single crystals free from pores.

In further another method for growing single crystals of barium titanate and barium titanate solid solutions according to the present invention, the single crystal of barium titanate is adjoined to the polycrystal of the barium titanate and barium titanate solid solutions, followed by heat treatment, thereby causing an abnormal grain growth at an interface between the single crystal and the polycrystal to continuously grow the same structure as the seed single crystal in the polycrystal. Accordingly, the single crystal of barium titanate and barium titanate solid solutions thus obtained in the polycrystal has the same composition as that of the original polycrystal adjoined to the single crystal, and the same structure as that of the seed single crystal. Such a single crystal having the composition of the polycrystal and the structure of the seed single crystal is called "single crystal of polycrystal composition" in this specification.

The single crystal of a different composition thus obtained in the above-stated method of the present invention is reused as a seed single crystal and adjoined to the polycrystal, so that the same structure as the seed single crystal is continuously grown in the polycrystal to produce a single crystal of polycrystal composition. That is, the single crystals prepared by the present invention are recycled as a seed single crystal so as to lower the cost of the seed single crystal.

Figure 8:
FIG. 8 is an illustration showing a seed single crystal (i.e., a single crystal of barium titanate as a primary seed single crystal) adjoined to a polycrystal of barium titanate or barium titanate solid solutions in the method of the present invention.

FIG. 8 is an illustration showing the seed single crystal (i.e., a single crystal of barium titanate as a primary seed single crystal) adjoined to the polycrystal of barium titanate or barium titanate solid solutions.

As shown in FIG. 8, in order to adjoin the seed single crystal onto the polycrystal, the seed single crystal is placed on a powder molded body or the polycrystal, or embedded in the powder, followed by heat treatment. Alternatively, the seed single crystal adjoined to the polycrystal is embedded in the powder and the mixture is subjected to a molding.

Depending on the powder composition, the temperature and atmosphere of heat treatment, a secondary abnormal grain growth occurs in the barium titanate and barium titanate solid solutions, in which case the size and number of secondary abnormal grains thus obtained are variable. The method of the present invention varies the powder composition, and the temperature and atmosphere of heat treatment to control the secondary abnormal grain growth in the polycrystal such that the secondary abnormal grain growth is restrained in the polycrystal but activated at an interface between the polycrystal and the seed single crystal, thereby allowing the same structure as the single crystal to grow into the polycrystal.

Also, the present invention performs a heat treatment using a temperature gradient that the temperature at an interface between the seed single crystal and the polycrystal is higher than that in the polycrystal, so as to promote the growth of the same structure as the seed single crystal at the interface and restrain the secondary abnormal grain growth in the polycrystal. Alternatively, the invention performs a heat treatment with an additive for promoting the secondary abnormal grain growth at an interface between the seed single crystal and the polycrystal in order to provide a condition for the same structure as the seed single crystal to rapidly grow, resulting in a single crystal large enough for practical uses.

That is, the method for barium titanate and barium titanate solid solutions uses a secondary abnormal grain growth occurring at an interface between the single crystal of barium titanate and the polycrystal of barium titanate and barium titanate solid solutions to produce a large single crystal of barium titanate (at least 20 mm×20 mm). The large single crystal thus obtained is reused as a seed single crystal and adjoined to the polycrystal of barium titanate and barium titanate solid solutions, as a result of which the same structure as the single crystal of barium titanate grows continuously into the polycrystal.

Based on the fact that the single crystal grown in the polycrystal has the same crystal orientation as that of the seed single crystal, the method for barium titanate and barium titanate solid solutions according to the present invention predetermines the crystal orientation of the seed single crystal, grinds a specific crystal face of the seed single crystal in the crystal orientation determined, and adjoins the ground seed single crystal to the polycrystal, thereby easily determining the crystal orientation of a single crystal to be grown in the polycrystal from the seed single crystal.

Based on the fact that the single crystal completely grown in the polycrystal from the seed single has the same shape of the polycrystal adjoined to the seed single crystal, the method for barium titanate and barium titanate solid solutions according to the present invention molds the polycrystal powder to a desired shape or processes the polycrystal into a complex shape, and then adjoins the shaped polycrystal to the seed single crystal, to produce a single crystal of a desired complex shape without a separate and high-cost processing step of the single crystal.

Furthermore, the method for barium titanate and barium titanate solid solutions according to the present invention controls polycrystal composition, temperature, temperature gradient and atmosphere in order to cause the secondary abnormal grain growth only at an interface between the seed single crystal and the polycrystal while restraining the secondary abnormal grain growth in the polycrystal. The powder molded body is first sintered under a reductive atmosphere to prepare a polycrystal having a uniform structure without secondary abnormal grain growth, and a seed single crystal is placed on the sintered body, after which a heat treatment is performed at a temperature under air atmosphere to allow the seed single crystal to continuously grow into the polycrystal.

The present invention will be described below by way of Embodiment 8. However, the same heat treatment and sintering process may be performed without respect to the presence of $TiO_2$ or other additives in preparing a polycrystal from barium titanate sintered. The seed single crystal as used herein is not limited to barium titanate and may include other oxides having the same crystallographic structure as barium titanate, such as $SrTiO_3$ or $CaTiO_3$. The following examples are intended only to further illustrate the invention and are not intended to limit the scope of the invention, which is defined by the claims.

Now, a description will be given to the Examples of a method for growing single crystals of barium titanate [$BaTiO_3$] in accordance with the present invention.

EXAMPLE 1

The barium titanate powder as used in this Example had a Ba/Ti ratio of about 0.997 and contained as impurities 0.15 wt % of SrO and 0.1 wt. % of $P_2O_5$. A molded body (20 mm×20 mm×2 mm) was prepared from barium titanate powder (2 g) and subjected to cold isostatic pressing (CIP) step at a hydrostatic pressure of 200 MPa. The molded body was then subjected to a heat treatment for one hour at 1360° C. slightly above the critical temperature where the secondary abnormal grain growth starts to occur, in order to create a few secondary abnormal grains during the process of sintering the molded body.

The secondary abnormal grain growth activating temperature is generally dependent upon the Ba/Ti ratio or the type and additive content of the barium titanate powder. In this Example, the secondary abnormal grain growth activating temperature was about 1355° C., i.e., between 1350° C. and 1360° C.

As shown in FIG. 2, the sample was subjected to a heat treatment for one hour at 1360° C. slightly above the secondary abnormal grain growth activating temperature to generate a secondary abnormal grain, and then to a second heat treatment for 100 hours at 1350° C. slightly below the secondary abnormal grain growth activating temperature, so that only one secondary abnormal grain continued to grow without a secondary abnormal grain formed in the rest part of the sample. Thus, the most part of the sample was changed to a single crystal as a large secondary abnormal grain. The speed of the growth was approximately 300 to 500 μm/h. FIG. 3 shows microscopic photographs showing the samples with the single crystal of barium titanate grown in the Example of the present invention.

EXAMPLE 2

A molded body in the form of a square column (40 mm×5 mm×2 mm) was prepared from a barium titanate powder and subjected to the CIP step at a hydrostatic pressure of 200 MPa. Here, there was added an additive for lowering the secondary abnormal grain growth activating temperature of barium titanate, the additive being at least one selected from the group consisting of $Al_2O_3$, $B_2O_3$, CuO, $GeO_2$, $Li_2O_3$, $MnO_2$, $P_2O_5$, PbO, $SiO_2$, $TiO_2$, and $V_2O_5$. As shown in FIG. 5, about 0.1 mg of the additive was placed on an area of 1 $mm^2$ at one edge of the molded body.

Figure 7:
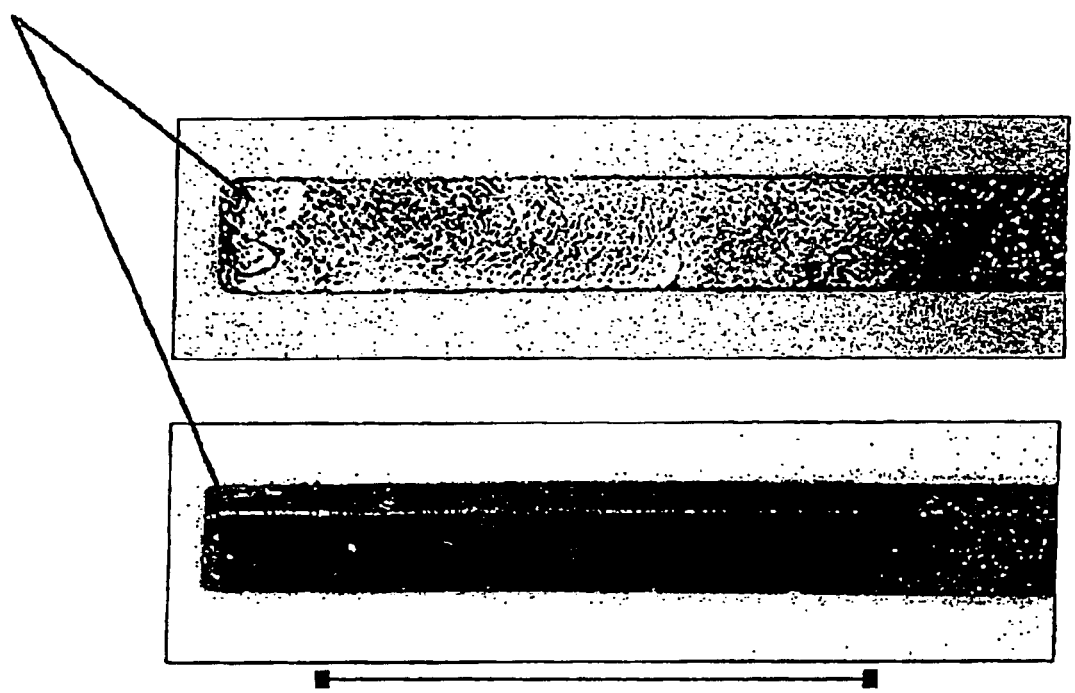
FIG. 7 is a microscopic photograph of a single crystal having a size of more than 2 cm grown in the sample after 100 hours of heat treatment at 1350° C. by the method of the present invention.

The molded body thus prepared was subjected to a heat treatment so that a secondary abnormal grain was nucleated only around the part of the powder to which the additive was locally added. The secondary abnormal grain growth activating temperature of the barium titanate powder was about 1355° C., but the secondary abnormal grain was created around the additive at a temperature slightly lower than 1355° C. Actually, a large secondary abnormal grain (single crystal) was obtained after 100 hours of heat treatment at 1350° C. The speed of the growth was approximately 300 to 500 μm/h and the number of the single crystal grown in the sample was controlled to be one. FIG. 7 is a microscopic photograph of a single crystal having a size of more than 2 cm grown in the sample after 100 hours of heat treatment at 1350° C.

Now, a description will be given to an Example of a method for growing single crystals of a barium titanate solid solution $[(Ba_xM_{1-x})(Ti_yN_{1-y})O_3]$ in accordance with the present invention.

EXAMPLE 3

The barium titanate powder as used in this Example had a Ba/Ti ratio of about 0.997 and contained as impurities 0.15 wt % of SrO and 0.1 wt. % of $P_2O_5$. A molded body in the form of a disc 15 mm in diameter and 7 mm high was prepared from a powder mixture (2.5 g) comprising 99.9 mol % of $BaTiO_3$ and 0.1 mol % of MnO, followed by the CIP step at a hydrostatic pressure of 200 MPa. The molded body was then subjected to a heat treatment for one hour at 1360° C. slightly above the critical temperature where the secondary abnormal grain growth starts to occur, in order to create a few secondary abnormal grains during the process of sintering the molded body. Thereafter, a second heat treatment was performed on the molded body for 50 hours at 1350° C. slightly below the secondary abnormal grain growth activating temperature. FIG. 4 is a microscopic photograph showing the appearance of a sample with a single crystal of the barium titanate solid solution as obtained in the Example of the present invention.

The secondary abnormal grain growth activating temperature generally depends on the Ba/Ti ratio of the powder, the type and content of the additive insoluble in the barium titanate, or the type and content of the solute soluble in the barium titanate. In this Example, the secondary abnormal grain growth activating temperature was about 1355° C., i.e., between 1350° C. and 1360° C.

The number and size of the single crystals finally obtained in the sample after heat treatment is largely dependent upon the temperature and time of the heat treatment for creating and growing secondary abnormal grains. Namely, the temperature of the heat treatment must be high enough to cause a rapid growth of the single crystal but slightly below the secondary abnormal grain growth activating temperature, in which case only the secondary abnormal grains already created continue to grow into a large single crystal while restraining the nucleation of another secondary abnormal grains.

Now, a description will be given to another methods for growing single crystals of barium titanate and barium titanate solid solutions from seed single crystals in accordance with the present invention.

EXAMPLE 4

The abnormal grain growth of barium titanate occurs in two stages, i.e., as primary and secondary abnormal grain growths with increasing temperature higher than the liquid formation temperature, and depends on the Ba/Ti ratio in the barium titanate powder or the type and content of the additive used. The secondary abnormal grain growth provides a small number of abnormal grains per unit area with simplicity in production control, and is thus applicable to a single crystal growth. The barium titanate powder as used in this Example had a Ba/Ti ratio of about 0.997 and contained as impurities 0.15 wt % of SrO and 0.1 wt. % of $P_2O_5$. The critical temperature where the secondary abnormal grain growth starts to occur is generally dependent upon the Ba/Ti ratio or the content of the additive in the barium titanate powder. In this Example, the secondary abnormal grain growth activating temperature was about 1355° C.

A molded body in the form of a disc 15 mm in diameter and 7 mm high was prepared from the barium titanate powder (2.5 g) and subjected to the CIP step at a hydrostatic pressure of 200 MPa. A single crystal of barium titanate 3 mm in diameter and 1 mm high was placed on the molded body and subjected to a heat treatment.

Figure 9:
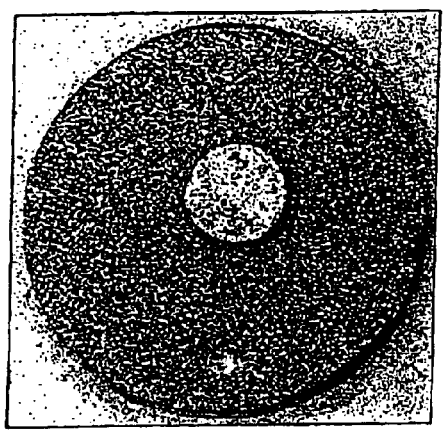
FIGS. 9a–d are microscopic photographs showing the appearance of samples prepared with a single crystal of barium titanate placed on a polycrystal of barium titanate, and subjected to 15 hours of heat treatment in the air at (a) 1340° C., (b) 1350° C., (c) 1360° C. and (d) 1370° C., respectively.
Figure 9:
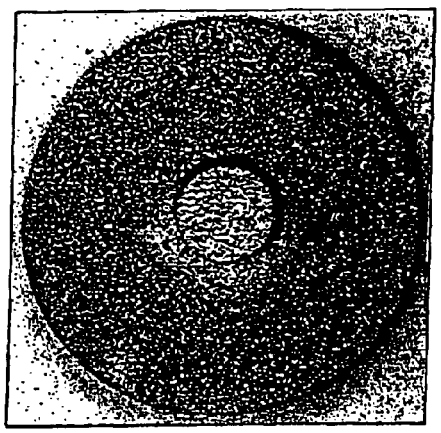
Figure 9:
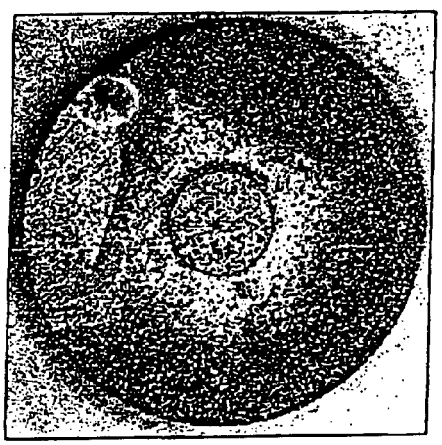
Figure 9:
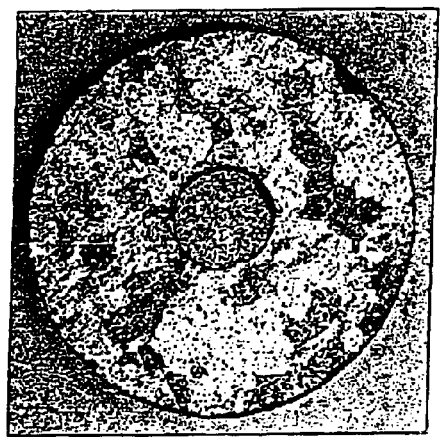

FIG. 9 is microscopic photographs showing the appearance of samples prepared with a single crystal of barium titanate placed on the disc-shaped barium titanate molded body 15 mm in diameter and 7 mm high, and subjected to 15 hours of heat treatment in the air at (a) 1340° C., (b) 1350° C., (c) 1360° C. and (d) 1370° C., respectively. At 1340° C. lower than the secondary abnormal grain growth activating temperature of barium titanate polycrystals, there was no seed single crystal grown and no secondary abnormal grain growth occurred in the polycrystals. At 1350° C., the same structure as the seed single crystal was grown into the polycrystals at an interface and the speed of the growth was about 100 to 300 μm/h. At 1360° C., the secondary abnormal grain growth began to occur in the polycrystals. At 1370° C., the secondary abnormal grain growth took place vigorously in the polycrystals to restrain a growth of the seed single crystal and inhibit the same structure as the seed single crystal from growing continuously into the polycrystals, as a result of which no single crystal was grown in the polycrystals.

Figure 10:
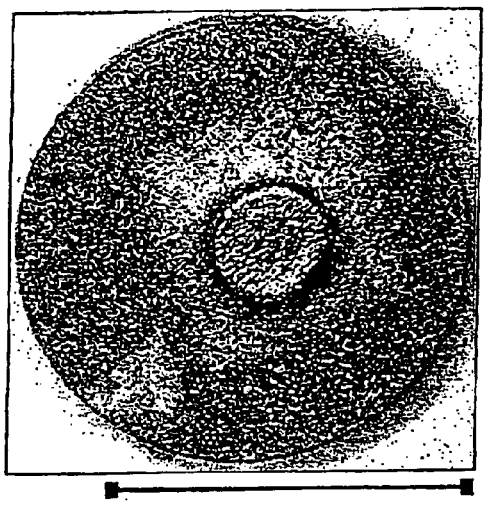
FIG. 10 is a microscopic photograph showing the appearance of a sample prepared with a single crystal of barium titanate embedded in a barium titanate powder, and subjected to 15 hours of heat treatment at 1350° C.

FIG. 10 is a microscopic photograph showing the appearance of a sample prepared with a single crystal of barium titanate embedded as a seed single crystal in a barium titanate powder, molded, and subjected to 15 hours of heat treatment at 1350° C. according to the method of the present invention. During the heat treatment, the same structure as the seed single crystal continued to grow into a large single crystal of barium titanate having a size larger than 7 mm×7 mm. Irrespective of the method for implanting the seed single crystal in the barium titanate polycrystal, a heat treatment at a temperature slightly below the secondary abnormal grain growth activating temperature allowed the same structure as the seed single crystal to grow continuously into the polycrystal, thereby providing a large single crystal in the polycrystal. The size of the single crystal thus obtained increased in proportion to the increase in the time of heat treatment.

Figure 11:
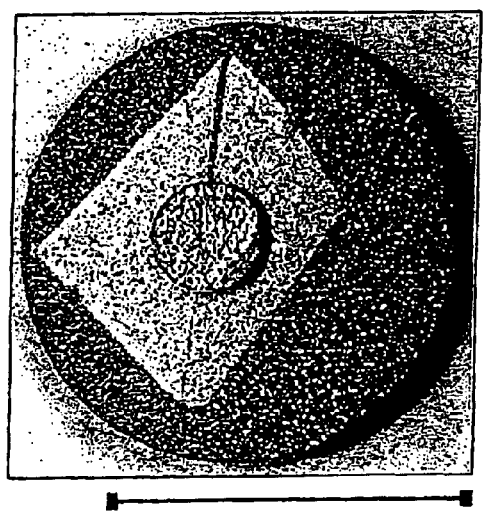
FIG. 11 is a microscopic photograph showing the appearance of a sample prepared with a single crystal of barium titanate including a (111) double twin placed on a polycrystal of barium titanate, and subjected to 15 hours of a heat treatment at 1350° C.

FIG. 11 is a microscopic photograph showing the appearance of a sample prepared with a barium titanate single crystal including a (111) double twin placed on a molded body of the barium titanate powder 15 mm in diameter and 7 mm high, and subjected to 15 hours of a heat treatment at 1350° C. In the case of using a single crystal of barium titanate including a defect such as a (111) double twin as shown in FIG. 11, the (111) double twin was also observed in the single crystal grown in the polycrystal and the speed of the single crystal growth in the polycrystal was higher than that in the case of using a single crystal of barium titanate destitute of the (111) double twin. It is thus considered that a defect such as the (111) double twin accelerated the single crystal growth into the polycrystal. In FIG. 11, a small single crystal of barium titanate including a (111) double twin was joined to a polycrystal of barium titanate to produce a large single crystal of barium titanate including a (111) double twin, which single crystal was reused as a seed single crystal so as to prepare a larger single crystal of barium titanate rapidly.

Figure 12:
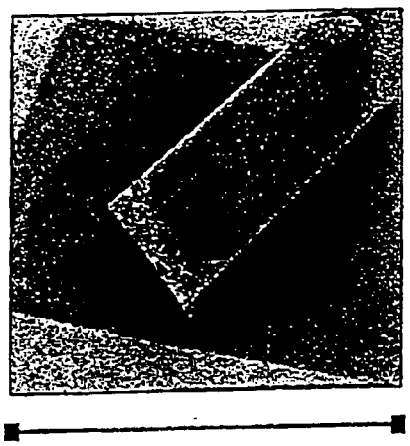
FIG. 12 is a microscopic photograph showing the appearance of a sample prepared with a large seed single crystal of barium titanate (25 mm×10 mm×5 mm) placed on a polycrystal of barium titanate, and subjected to 100 hours of heat treatment at 1350° C.

FIG. 12 is a microscopic photograph showing the appearance of a sample prepared with a single crystal of barium titanate (25 mm×10 mm×5 mm) as a seed single crystal placed on a molded body (40 mm×40 mm×7 mm) formed from barium titanate powder (25 g) by the CIP step at a hydrostatic pressure of 200 MPa, and subjected to 100 hours of heat treatment at 1350° C. Using a large seed single crystal resulted in a wide interface between the seed single crystal and the polycrystal, which provided a large surface for single crystal growth. A larger seed single crystal provided a higher speed of the growth from a polycrystal to a single crystal. It was observed that using a larger seed single crystal of barium titanate produced a larger single crystal of barium titanate at a higher speed.

For barium titanate, a secondary abnormal grain growth occurred only at an elevated temperature higher than the secondary abnormal grain growth activating temperature, but the secondary abnormal grain once generated was allowed to grow even at a temperature lower than the secondary abnormal grain growth activating temperature. When the single crystal of barium titanate was joined to the polycrystal of barium titanate and subjected to a heat treatment at a temperature slightly below the secondary abnormal grain growth activating temperature, no secondary abnormal grain growth occurred in the polycrystal, but the single crystal joined to the polycrystal acted as a secondary abnormal grain and was rapidly grown into the polycrystal. The single crystal of barium titanate was not grown when it was joined to the polycrystal and subjected to a heat treatment at a much lower temperature than the secondary abnormal grain growth activating temperature by more than 10° C. During a heat treatment at a temperature slightly below the secondary abnormal grain growth activating temperature, the same structure as the single crystal continued to grow into the polycrystal and thereby produce a single crystal as large as the polycrystal.

EXAMPLE 5

Figure 13:
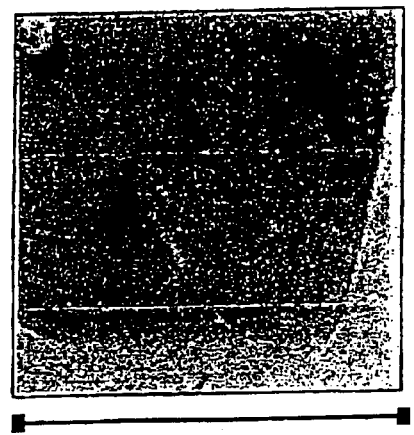
FIG. 13 is a microscopic photograph showing the appearance of a sample prepared with a small seed single crystal of barium titanate 3 mm in diameter and 1.5 mm thick placed on the edge of a polycrystal of barium titanate, and subjected to 300 hours of heat treatment with a temperature gradient such that the temperature is 1350° C. on the side of the seed single crystal and decreased to a temperature slightly below 1350° C. on the opposite edge side of the sample.

FIG. 13 is a microscopic photograph showing the appearance of a sample prepared with a small single crystal of barium titanate 3 mm in diameter as a seed single crystal placed on the edge of a molded body (40 mm×40 mm×7 mm) formed from barium titanate powder (25 g) by the CIP step at a hydrostatic pressure of 200 MPa, and subjected to 300 hours of heat treatment with a temperature gradient such that the temperature is 1350° C. on the side of the seed single crystal and decreased to a temperature slightly below 1350° C. on the opposite edge side of the sample. Due to the temperature gradient, the polycrystal side was at a temperature slightly below the secondary abnormal grain growth activating temperature so as not to create a secondary abnormal grain. However, the seed single crystal, at a temperature lower than the secondary abnormal grain growth activating temperature, continued to grow into the polycrystal, thereby obtaining a large single crystal (25 mm×25 mm×5 mm). Here, the temperature gradient was used to effectively inhibit a secondary abnormal grain growth in the polycrystal so that the same structure as the seed single crystal continued to grow without being disturbed by the secondary abnormal grain, thus producing a large single crystal (at least 25 mm×25 mm×5 mm).

Figure 14:
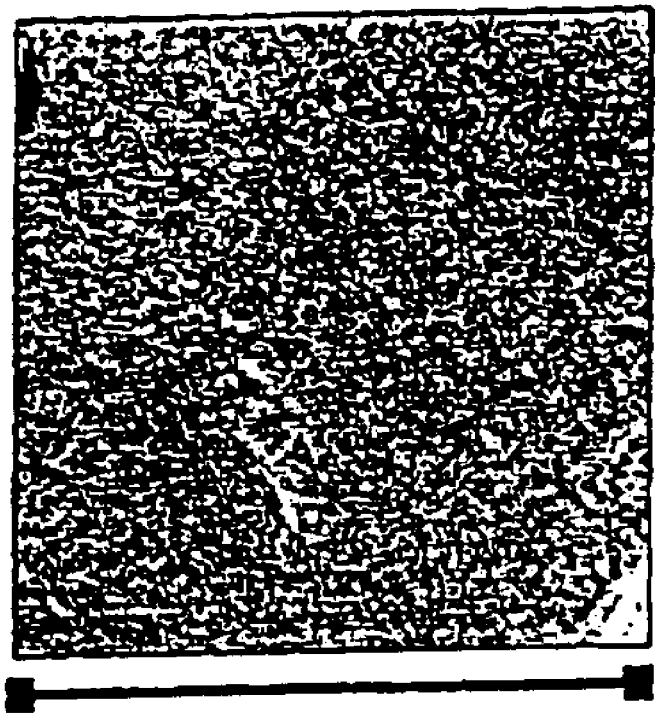
FIG. 14 is a microscopic photograph showing a single crystal of barium titanate (25 mm×25 mm×5 mm) isolated from a sample with a single crystal grown from a seed single crystal according to the method of the present invention.

FIG. 14 is a microscopic photograph showing a single crystal of barium titanate (25 mm×25 mm×5 mm) isolated from a sample with a single crystal grown from a seed single crystal of barium titanate according to the method of the present invention. The single crystal of barium titanate which was larger than 20 mm×20 mm as prepared by the method of the present invention is large enough for practical uses. Reusing the single crystal of barium titanate larger than 20 mm×20 mm as a seed single crystal makes it possible to prepare a single crystal of a perovskite type oxide having a different composition in a size larger than 20 mm×20 mm, which is otherwise actually difficult to grow by using the liquid-state single crystal growth method.

The size of the single crystal finally obtained from the sample after heat treatment was dependent upon the temperature and time of heat treatment, the temperature gradient, the type and content of the additive, and the size of the seed single crystal, i.e., a larger single crystal was obtained from a larger seed single crystal with an increased time for heat treatment. Although the temperature had to be high enough to enable a rapid growth of the single crystal, one large single crystal can be produced without disturbing the growth of the seed single crystal only at a temperature lower than the secondary abnormal grain growth activating temperature, since such a low temperature restrains the creation of another secondary abnormal grain.

EXAMPLE 6

For barium titanate, the secondary abnormal grain growth activating temperature and the number of secondary abnormal grains per unit area are variable depending on the Ba/Ti ratio in the barium titanate powder, and the type and content of an additive. There are some cases where no secondary abnormal grain growth is observed at an extremely high or low Ba/Ti ratio or in the presence of a specific additive. An additive in the barium titanate powder to form a solid solution with barium titanate causes the grown single crystal to become a solid solution of the barium titanate and the additive as well as varies the behavior of the secondary abnormal grain growth. In this Example, a barium titanate powder was blended with an additive to obtain a polycrystal and a heat treatment was performed around the secondary abnormal grain growth activating temperature to promote the single crystal growth, thereby preparing a single crystal of barium titanate having a solid solution composition.

Here, at least one additive selected from the group consisting of $BaO$, $Bi_2O_3$, $CaO$, $CdO$, $CeO_2$, $CoO$, $Cr_2O_3$, $Fe_2O_3$, $HfO_2$, $K_2O$, $La_2O_3$, $MgO$, $MnO_2$, $Na_2O$, $Nb_2O_5$, $Nd_2O_3$, $NiO$, $PbO$, $Sc_2O_3$, $SmO_2$, $SnO_2$, $SrO$, $Ta_2O_5$, $TiO_2$, $UO_2$, $Y_2O_3$, $ZnO$, and $ZrO_2$, which are known to form a solid solution with barium titanate, was used in order to prepare a single crystal of barium titanate having a solid solution comprising 100-x mol % of $BaTiO_3$ and x mol % of MO. Disc-shaped molded bodies 15 mm in diameter and 7 mm high were prepared from the powder mixture (2.5 g) comprising 100-x mol % of $BaTiO_3$ and x mol % of MO, followed by the CIP step at a hydrostatic pressure of 200 MPa. The molded bodies were then subjected to a heat treatment at different temperatures so as to determine the secondary abnormal grain growth activating temperature for the respective compositions depending on the type and content of the solute, after which the polycrystal of the solid solution composition joined to a seed single crystal was subjected to a second heat treatment at a low temperature slightly below the secondary abnormal grain growth activating temperature determined previously.

Figure 15:
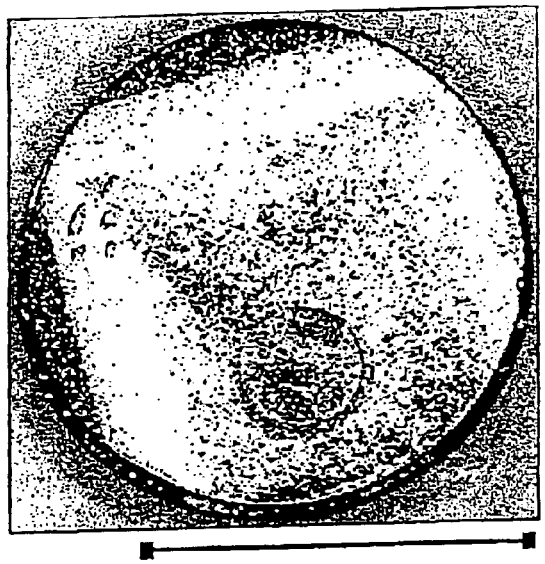
FIG. 15 is a microscopic photograph showing a sample prepared with a single crystal of barium titanate placed on a polycrystal of barium titanate comprising 99.9 mol % of $BaTiO_3$ and 0.1 mol % of $CrO_{1.5}$, and subjected to a heat treatment at about 1350° C. for 50 hours.

FIG. 15 is a microscopic photograph showing a sample prepared with a single crystal of barium titanate 3 mm in diameter placed on a molded powder 15 mm in diameter and 7 mm high comprising 99.9 mol % of $BaTiO_3$ and 0.1 mol % of $CrO_{1.5}$ and subjected to a heat treatment at 1350° C. for 50 hours. Here, the secondary abnormal grain growth activating temperature for the powder of the above composition was observed as about 1355° C. During heat treatment, no secondary abnormal grain growth occurred in the polycrystal but the seed single crystal continuously grew into the polycrystal to produce a large single crystal having a size larger than 10 mm×10 mm. The speed of the single crystal growth was approximately 200 to 500 μm/h, which was higher than that of barium titanate containing no additive. The single crystal of the solid solution composition is different from that of undoped barium titanate in various properties such as chemical stability, lattice constant, phase change temperature, etc. and thus usable as a seed single crystal instead of the single crystal of undoped barium titanate, which are unusable as a seed single crystal in some cases.

Figure 16:
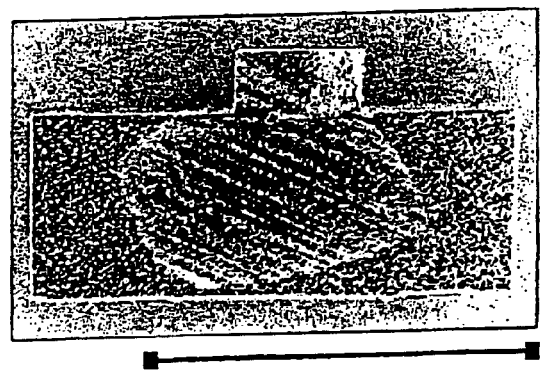
FIG. 16 is a microscopic photograph showing a sample prepared with a single crystal of barium titanate placed on a polycrystal of barium titanate comprising 99.9 mol % of $BaTiO_3$ and 0.1 mol % of $CeO_2$ and subjected to a heat treatment at 1350° C. for 50 hours.

FIG. 16 is a microscopic photograph showing a sample prepared with a single crystal of barium titanate 3 mm in diameter placed on a powder molded body 15 mm in diameter and 7 mm high comprising 99.9 mol % of $BaTiO_3$ and 0.1 mol % of $CeO_2$ and subjected to a heat treatment at 1350° C. for 50 hours. In the photograph of the cross section of the sample shown in FIG. 16, the same structure as the seed single crystal of barium titanate was continuously grown into the polycrystal containing Ce, thereby providing a single crystal of barium titanate comprising Ce dissolved in the polycrystal. The interface between the seed single crystal and the single crystal grown in the polycrystal forms a continuous structure with a varied composition. This method prepared a single crystal of barium titanate having a solid solution composition with a composition gradient from a seed single crystal of undoped barium titanate.

Figure 17:
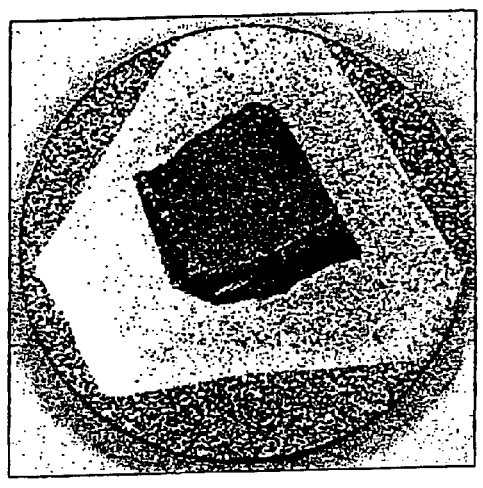
FIGS. 17(a) and 17(b) are microscopic photographs showing the surface and the cross section of a sample, respectively, prepared with a single crystal of barium titanate placed on a molded body and subjected to a heat treatment at 1350° C. for 50 hours, wherein the molded body is formed from a sequential laminate of three powders each 1.5 mm thick with a composition gradient of 99.9 mol % of $BaTiO_3$ and 0.1 mol % of $MnO_2$; 99.9 mol % of $BaTiO_3$ and 0.1 mol % of $NbO_{2.5}$; and 99.9 mol % of $BaTiO_3$ and 0.1 mol % of $CeO_2$ by the CIP step at a hydrostatic pressure of 200 Mpa.
Figure 17:
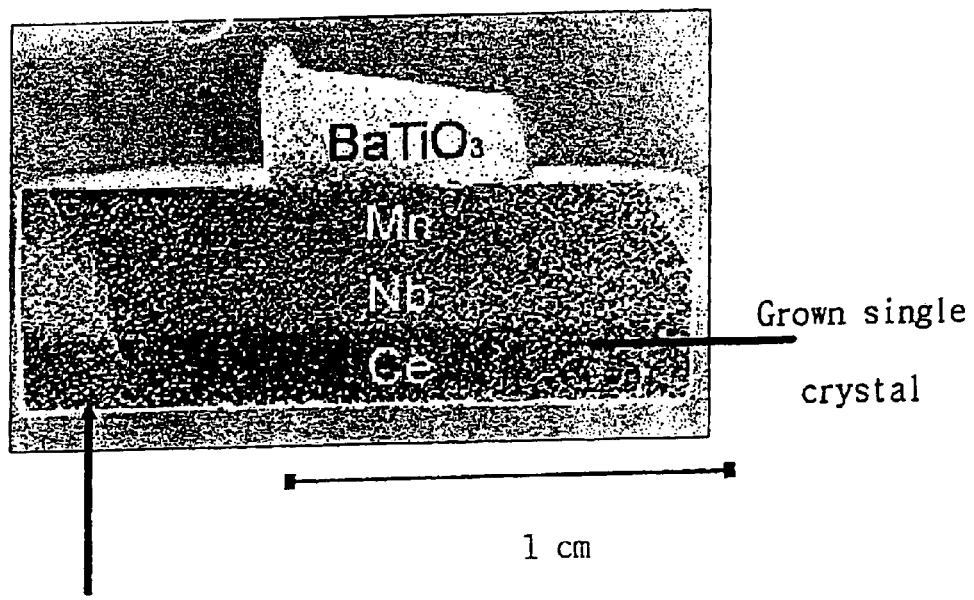

FIGS. 17(a) and 17(b) are microscopic photographs showing the surface and the cross section of a sample, respectively, prepared with a single crystal of barium titanate placed on a molded body and subjected to a heat treatment at 1350° C. for 50 hours, wherein the molded body was formed from a sequential laminate of three powders each 15 mm in diameter and 1.5 mm thick with a composition gradient of 99.9 mol % of $BaTiO_3$ and 0.1 mol % of $MnO_2$; 99.9 mol % of $BaTiO_3$ and 0.1 mol % of $NbO_{2.5}$; and 99.9 mol % of $BaTiO_3$ and 0.1 mol % of $CeO_2$ by the CIP step at a hydrostatic pressure of 200 MPa. The single crystal of barium titanate started to grow in a region containing $MnO_2$ and continuously grew towards a region containing $NbO_{2.5}$ and $CeO_2$ to produce a single crystal of a barium titanate solid solution with a continuous composition variation, which is composed of four regions, i.e., undoped barium titanate, Mn solid solution, Nb solid solution and Ce solid solution. It is one of the most important advantages of the solid-state single crystal growth (SSCG) method over the liquid-state single crystal growth (LSCG) method that it is easy to produce a single crystal having a composition gradient.

EXAMPLE 7

The microstructure of a sintered body of barium titanate can be changed in regard to size and shape of grains, porosity, and pore shape by controlling those factors that affect the grain growth and densification condition of the sintered body, such as sintering temperature, sintering atmosphere (e.g., air, oxygen or vacuum), pressure at uniaxial hot pressing or hot isostatic pressing, liquid content and powder composition (e.g., Ba/Ti ratio, the type and content of an additive, etc.). The porosity of the sintered body affects that of the final single crystal as well as the growth behavior. Accordingly, single crystals having various structures, such as single crystals with or without pores, and of different sizes or shapes can be prepared by controlling the microstructure of the polycrystal.

Table 1 shows the relative density of sintered bodies of an undoped barium titanate powder, a powder mixture comprising 99.9 mol % of $BaTiO_3$ and 0.1 mol % of CeO, and a powder mixture comprising 99.9 mol % of $BaTiO_3$ and 0.1 mol % of $NbO_{2.5}$ subjected to heat treatment under different conditions.

TABLE 1

| Sintering Condition Composition (mol %) | 1350° C., Air, 1 hour (Sintering in Air) | 1300° C. Vacuum, 1 hour (Sintering in Vacuum) | 1300° C., Vacuum, 1 hour → 1350° C., Air, 1 hour, (Primary and Secondary Sintering) | 1300° C., Vacuum, 1 hour → 1350° C., Air, 1 hour, 50 Mpa (Pressure Sintering) |
|---|---|---|---|---|
| Undoped $BaTiO_3$ | 95% | 98.7% | 98.4% | 99.5% |
| (99.9) $BaTiO_3$-(0.1) $NbO_{2.5}$ | 95.7% | 98.7% | 98.2% | 99.6% |
| (99.9) $BaTiO_3$-(0.1) $CeO_2$ | 96.7% | 98.8% | 98.4% | 99.7% |

The undoped barium titanate sample sintered in air had a relative density of 95% and resulted in a single crystal of undoped barium titanate with a relative density of 95%. The addition of Ce or Nb raised the relative sintering density to more than 96% to produce denser single crystal. The three powders sintered under vacuum exhibited a high relative density of about 99% and maintained a high density of about 98.5% after a second heat treatment in air. A single crystal grown in air after a first vacuum sintering resulted in a single crystal having a relative density of about 98.5%. The first vacuum sintering, followed by a pressure sintering in air provided a completely dense sintered body and hence single crystals of undoped barium titanate and solid solutions without pores.

A control of the density of the polycrystal adjoined to the seed single crystal using the additive, heat treatment temperature and atmosphere (vacuum, air, oxygen partial pressure, etc.) and pressure made it possible to control the porosity of the single crystal and the size and amount of pores, thereby producing single crystals of barium titanate and barium titanate solid solutions having a different size and shape of pores and a different porosity.

Figure 18:
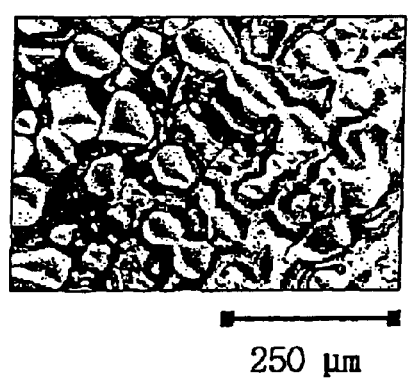
FIGS. 18a–c shows microscopic photographs of a sample prepared with a seed single crystal placed on a polycrystal of barium titanate and subjected to a heat treatment at 1350° C. for 50 hours, wherein (a) shows the surface of the sample at an interface between the grown single crystal and the polycrystal, (b) shows the sample partly removed of the curved surface thereof by grinding, and (c) shows the sample completely removed of the curved surface thereof by grinding.
Figure 18:
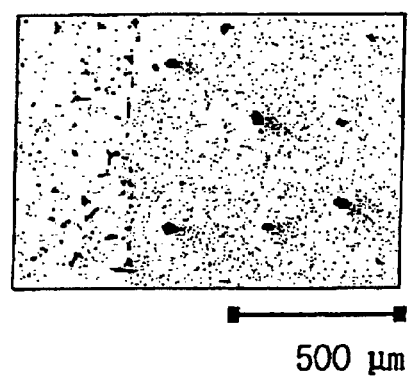
Figure 18:
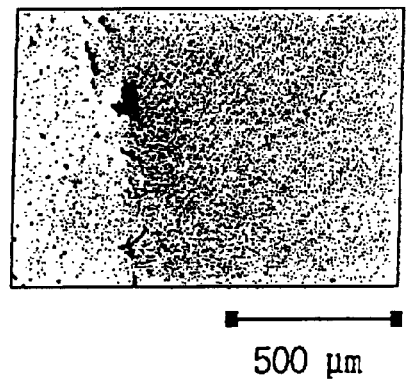

FIG. 18 shows microscopic photographs of a sample prepared with a seed single crystal placed on a polycrystal of barium titanate and subjected to a heat treatment at 1350° C. for 50 hours, wherein (a) shows the surface of the sample at an interface between the grown single crystal and the polycrystal, (b) shows the sample partly removed of the curved surface thereof by grinding, and (c) shows the sample completely removed of the curved surface thereof by microscopic grinding. The sintered polycrystal of barium titanate and the grown single crystal had a relative density of about 95%. The photograph (a) shows the surface of the single crystal grown is severely curved without a pore. The surface of the single crystal partly removed of protrusions at the curved portion by microscopic grinding in photograph (b) appears to have pores. A complete removal of the protrusions on the surface of the sample in photograph (c) resulted in a smooth and flat surface of the single crystal destitute of pores. The single crystal grown in the heat treatment includes pores but has a dense layer destitute of pores on the surface. So, a single crystal having a dense surface structure without a pore can be produced when removed of protrusions from the surface thereof so as not to expose internal pores of the single crystal by microscopic grinding. This process, when using a sintered body of a high density, easily provides a single crystal having a surface structure free from a pore.

EXAMPLE 8

The barium titanate powder used in this Example has an average particle size of 0.5 $\mu$m, a Ba/Ti ratio of 0.994 and a purity of more than 99.98% and contained SrO, $Al_2O_3$ and $SiO_2$ as major impurities. The $TiO_2$ powder had a purity of 99.9% and an average particle size of 0.3 $\mu$m. The barium titanate powder and $ZrO_2$ balls were added to a polyethylene bottle and wet milled with an alcohol solvent for 24 hours. After being dried and pulverized, the mixture was injected into a metal mold and formed into a disc 9 mm in diameter and 5 mm thick, followed by the CIP step at a pressure of 200 MPa. This green compact thus obtained was subjected to 10 hours of heat treatment at 1250° C. under hydrogen atmosphere in a vertical tube furnace, to produce a polycrystal whose abnormal grain growth was restrained.

To provide a liquid phase on the sintered body of the polycrystal, a seed single crystal was placed on an evenly applied $TiO_2$ powder and subjected to a heat treatment in the air at 1350° C. for 24 hours.

Figure 19:
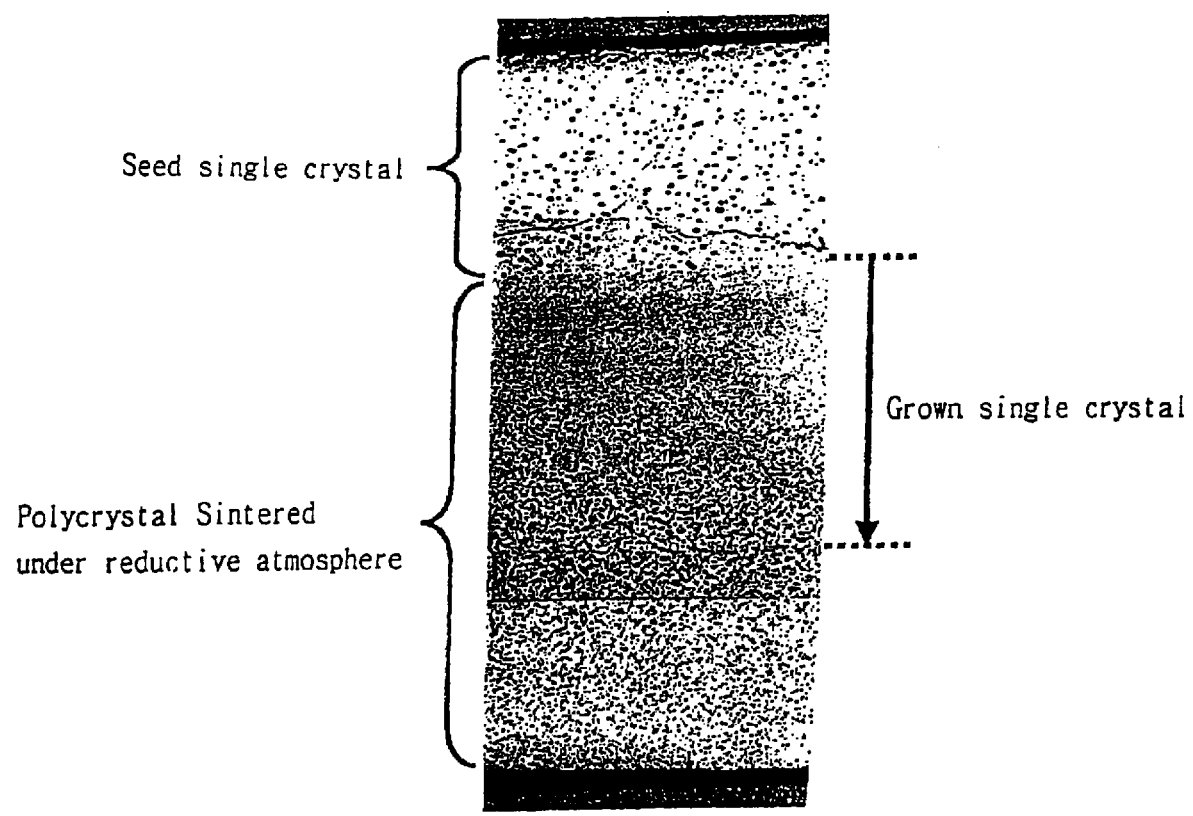
FIG. 19 is a microscopic photograph showing a sample prepared with a seed single crystal placed on a polycrystal of barium titanate sintered at 1250° C. for 10 hours under hydrogen atmosphere, and subjected to a second heat treatment at 1350° C. for 24 hours under air atmosphere.

FIG. 19 is a microscopic photograph showing a single crystal of barium titanate grown in this Example of the present invention. As illustrated in the figure, the single crystal thus obtained was about 2 mm thick and about 6 mm in diameter, which limited size resulted from a short time of heat treatment. Accordingly, a larger single crystal can be obtained from the sintered body of the larger polycrystal by a heat treatment for a sufficiently long time in air.

As described above, the method for growing single crystals of barium titanate [$BaTiO_3$] and barium titanate solid solutions [$(Ba_xM_{1-x})(Ti_yN_{1-y})O_3$] according to the present invention provides a manufacturing process for single crystals using a general and simple heat treatment method without special equipment or sophisticated skills, as a result of which a large amount of single crystals large enough for practical uses can be produced at a low cost. The method also enables production of single crystals having various additive contents by using a sintered body of the polycrystal with various additives added thereto. This method for growing single crystals of barium titanate and barium titanate solid solutions according to the present invention allows a growth of single crystals without a limitation in the size of the single crystal and provides high reproducibility of the single crystals with a composition gradient. The method also makes it possible to control the porosity of the single crystal, and the size and shape of pores, and prepare a complex single crystal from a polycrystal of a desired shape adjoined to the seed single crystal by heat treatment without a complicate step of processing a single crystal. This method of the present invention is efficient in the economical aspect because the final single crystals can be reused as a seed single crystal to produce various seed single crystals at a low cost, and also applicable to other systems showing an abnormal grain growth as well as barium titanate and barium titanate solid solutions.

It is to be noted that like reference numerals denote the same components in the drawings, and a detailed description of generally known function and structure of the present invention will be avoided lest it should obscure the subject matter of the present invention.

What is claimed is:

1. A method for growing single crystals of barium titanate or barium titanate solid solutions which exhibit primary and secondary abnormal grain growth by means of temperature conditions higher than a predetermined temperature, or a composition of a polycrystal and an atmosphere of heat treatment, the method comprising:
   a. providing a seed single crystal adjoined to a polycrystal; and
   b. performing a heat treatment at a temperature between a primary abnormal grain growth activating temperature and a secondary abnormal grain growth activating temperature of the polycrystal, thereby causing an abnormal grain growth in an interface between the polycrystal and the seed single crystal, and allowing only a few secondary abnormal grains having the same structure as the seed single crystal to grow continuously in the polycrystal.

2. The method according to claim 1 wherein the polycrystal is a polycrystal of barium titanate sintered under a reductive atmosphere to restrain the abnormal grain growth.

3. The method according to claim 1 wherein the barium titanate solid solution comprising barium titanate and at least one additive as a solute selected from the group consisting of BaO, $Bi_2O_3$, CaO, CdO, $CeO_2$, CoO, $Cr_2O_3$, $Fe_2O_3$, $HfO_2$, $K_2O$, $La_2O_3$, MgO, $MnO_2$, $Na_2O$, $Nb_2O_5$, $Nd_2O_3$, NiO, PbO, $Sc_2O_3$, $SmO_2$, $SnO_2$, SrO, $Ta_2O_5$, $TiO_2$, $UO_2$, $Y_2O_3$, ZnO and $ZrO_2$.

4. The method according to claim 1 further comprising preparing a polycrystal having a discrete or continuous composition gradient in a powder molded body from a barium titanate powder containing at least one additive selected from the group consisting of BaO, $Bi_2O_3$, CaO, CdO, $CeO_2$, CoO, $Cr_2O_3$, $Fe_2O_3$, $HfO_2$, $K_2O$, $La_2O_3$, MgO, $MnO_2$, $Na_2O$, $Nb_2O_5$, $Nd_2O_3$, NiO, PbO, $Sc_2O_3$, $SmO_2$, $SnO_2$, SrO, $Ta_2O_5$, $TiO_2$, $UO_2$, $Y_2O_3$, ZnO and $ZrO_2$, and subjecting the polycrystal to a heat treatment to prepare a single crystal of barium titanate with a composition gradient.

5. The method according to claim 1 further comprising, prior to step (a), preparing a polycrystal having a different porosity, pore size and pore shape by adding an additive to the polycrystal or changing the amount of a liquid phase or the sintering temperature, atmosphere, or pressure, to control the porosity and the pore size and shape in the single crystal to be grown in the polycrystal, thereby preparing a perfectly dense single crystal destitute of pores and a single crystal having varying pore structure.

6. The method according tyro claim 1 wherein a material for lowering the secondary abnormal grain growth activating temperature of the barium titanate or the barium titanate solid solution is locally added to the polycrystal of the barium titanate or the barium titanate solid solution.

7. The method according to claim 6 wherein the material for lowering the secondary abnormal grain growth activating temperature of the barium titanate or barium titanate solid solution comprises at least one additive selected from the group consisting of $Al_2O_3$, $B_2O_3$, CuO, $GeO_2$, $Li_2O_3$, $MnO_2$, $P_2O_5$, PbO, $SiO_2$, $TiO_2$, and $V_2O_5$.

8. The method according to claim 1 wherein the combination of the seed single crystal and the polycrystal is subjected to a heat treatment with a temperature gradient such that the temperature of the single crystal side is high and the temperature of the polycrystal side is low.

9. The method according to claim 1 wherein single crystals of an oxide having the same crystallographic structure as barium titanate or barium titanate solid solution are used as the seed single crystal.

10. The method according to claim 9 wherein the oxide is $SrTiO_3$ or $CaTiO_3$.

11. The method according to claim 1 wherein step (a) involves placing the seed single crystal on the polycrystal or the powder molded body of barium titanate or barium titanate solid solution or embedding the seed single crystal in the powder, and then performing a molding process; or adjoining the polycrystal to the seed single crystal, and then embedding the combination of the polycrystal and the seed single crystal in the powder and then performing a molding process.

12. The method according to claim 1 further comprising, prior to step (a), predetermining the crystal orientation of the seed single crystal, grinding a specific crystal face of the seed single crystal in the crystal orientation determined, and adjoining the ground seed single crystal to the polycrystal to determine the crystal orientation of a single crystal to be grown in the polycrystal from the seed single crystal.

13. The method according to claim 1 further comprising, prior to step (a), molding the polycrystal powder to a desired shape or processing the polycrystal into a complex shape, and then adjoining the shaped polycrystal to the seed single crystal to produce a single crystal of a desired shape without a separate step of processing the single crystal.

14. The method according to claim 1, further comprising, prior to step (a), growing a single crystal by performing a heat treatment on a small seed crystal placed on the polycrystal having pores to, and producing a single crystal having pores inside and destitute of pores on the surface thereof, using a perfectly dense layer formed on the surface of the grown single crystal.

15. The method according to claim 1 wherein, in step (a), a single crystal of barium titanate including a (111) double twin is used as a seed single crystal to provide the polycrystal adjoined to the (111) double twin.

16. The method according to claim 2 wherein the seed single crystal is grown under an oxidative atmosphere.

* * * * *